United States Patent
Fee et al.

(10) Patent No.: US 9,929,749 B2
(45) Date of Patent: *Mar. 27, 2018

(54) CLOCK PATH TECHNIQUE FOR USING ON-CHIP CIRCUITRY TO GENERATE A CORRECT ENCODE PATTERN TO TEST THE ON-CHIP CIRCUITRY

(71) Applicant: International Business Machines Corporation, Armonk, NY (US)

(72) Inventors: Michael Fee, Cold Spring, NY (US); Ronald J. Frishmuth, Poughkeepsie, NY (US); Mary P. Kusko, Hopewell Junction, NY (US); Cedric Lichtenau, Stuttgart (DE)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/425,164

(22) Filed: Feb. 6, 2017

(65) Prior Publication Data

US 2017/0261557 A1    Sep. 14, 2017

Related U.S. Application Data

(63) Continuation of application No. 15/063,953, filed on Mar. 8, 2016.

(51) Int. Cl.
*H03M 13/09* (2006.01)
*G01R 31/3177* (2006.01)
(Continued)

(52) U.S. Cl.
CPC ...... *H03M 13/093* (2013.01); *G01R 31/3177* (2013.01); *G01R 31/31855* (2013.01);
(Continued)

(58) Field of Classification Search
CPC ... G11C 29/52; G06F 11/10; G01R 31/31855; G01R 31/3177; G01R 31/31723; G01R 31/31721; H03M 13/093
See application file for complete search history.

(56) References Cited

U.S. PATENT DOCUMENTS 5,887,146 A * 3/1999 Baxter ............... G06F 11/22
710/104
6,158,032 A * 12/2000 Currier .......... G01R 31/318536
324/73.1

(Continued)

OTHER PUBLICATIONS

A. Leininger, M. Goessel and P. Muhmenthaler, "Diagnosis of scan-chains by use of a configurable signature register and error-correcting codes," Proceedings Design, Automation and Test in Europe Conference and Exhibition, 2004, pp. 1302-1307 vol. 2.*

(Continued)

*Primary Examiner* — Cynthia Britt
(74) *Attorney, Agent, or Firm* — Cantor Colburn LLP; William A. Kinnaman, Jr.

(57) ABSTRACT

Aspects include techniques for implementing a clock path technique for using on-chip circuitry to generate a correct encode pattern to test the on-chip circuitry for encoding and correction of a chip. A computer-implemented method may include initializing a scan of the chip including data and a set of check bits protecting the data; applying a global control bit to a latch on the chip; and applying an additional clock to the latch so the check bits are updated using the on-chip circuitry.

7 Claims, 7 Drawing Sheets

(51) Int. Cl.
   *G11C 29/52* (2006.01)
   *G01R 31/3185* (2006.01)
   *G06F 11/10* (2006.01)
   *G01R 31/317* (2006.01)

(52) U.S. Cl.
   CPC .............. *G06F 11/10* (2013.01); *G11C 29/52* (2013.01); *G01R 31/31721* (2013.01); *G01R 31/31723* (2013.01)

(56) References Cited

U.S. PATENT DOCUMENTS

| | | | | |
|---|---|---|---|---|
| 6,256,760 B1 * | 7/2001 | Carron | ............. | G01R 31/31919 714/726 |
| 6,779,142 B1 * | 8/2004 | Bhavsar | ......... | G01R 31/318536 714/726 |
| 7,139,950 B2 * | 11/2006 | Huisman | ........ | G01R 31/318536 714/726 |
| 7,234,090 B2 * | 6/2007 | Blasi | ............. | G01R 31/318569 714/726 |
| 2015/0070957 A1 * | 3/2015 | Otsuka | .................... | G11C 8/12 365/49.17 |

OTHER PUBLICATIONS

C. Galke, R. Kothe, S. Schultke, K. Winkler, J. Honko and H. T. Vierhaus, "Embedded scan test with diagnostic features for self-testing SoCs," 12th IEEE International On-Line Testing Symposium (IOLTS'06), Lake Como, 2006, pp. 2 pp.*

List of IBM Patents or Patent Applications Treated as Related; Date Filed: Feb. 6, 2017, p. 1-2.

Michael Fee, et al., "Bypassing an Encoded Latch on a Chip During a Test-Pattern Scan", U.S. Appl. No. 15/063,772, filed Mar. 8, 2016.

Michael Fee, et al., "Clock Path Technique for Using On-Chip Circuitry to Generate a Correct Encode Pattern to Test the On-Chip Circuitry", U.S. Appl. No. 15/063,953, filed Mar. 8, 2016.

Michael Fee, et al.,"Bypassing an Encoded Latch on a Chip During a Test-Pattern Scan", U.S. Appl. No. 15/425,159, filed Feb. 6, 2017.

* cited by examiner

CLOCK PATH TECHNIQUE FOR USING ON-CHIP CIRCUITRY TO GENERATE A CORRECT ENCODE PATTERN TO TEST THE ON-CHIP CIRCUITRY

DOMESTIC PRIORITY

This application is a continuation of U.S. patent application Ser. No. 15/063,953, entitled "CLOCK PATH TECHNIQUE FOR USING ON-CHIP CIRCUITRY TO GENERATE A CORRECT ENCODE PATTERN TO TEST THE ON-CHIP CIRCUITRY," filed Mar. 8, 2016, the disclosure of which is incorporated by reference herein in its entirety.

BACKGROUND

The present application relates generally to testing integrated circuits and, in particular, to techniques for built-in self-tests for encoded logic in an integrated circuit.

During the manufacturing process of integrated circuits (or "chips"), defects may occur. Testing of various combinations of paths across the chips using fault models is used to detect defects in logic of the chips. There is an increasing amount of error checking and correcting (ECC) protected logic in chips and, by its nature, it is difficult to fully test the logic with random pattern testing. ECC codes deliberately increase the code space to add enough capability to correct from some known failure. This results in random patterns asserted on the additional check bits that may result in error states. Through random pattern logic testing, the odds of having a correct ECC check bit pattern for a set of data is very small. Thoroughly testing the ECC protected logic is highly important. With random testing, the vast majority of the time, the logic is exercised with the incorrect check-bits; however, the ECC protected logic needs to be tested at least some of the time with the correct ECC pattern.

Logic built-in self-test (LBIST) is a test method where a device under test (e.g., a chip) is initialized and then tests itself using a test clock(s). The clocking can be controlled via a tester or it can be programmed into on-product control logic (OPCL) within the chip. In this situation, only a reference clock is needed. LBIST is highly efficient in both tester time and memory usage and is also extendable to all packaging levels including a customer's environment. LBIST can be used to thoroughly test all the random logic on a chip including the ECC logic.

The chip may be configured in a self-test using MISRs and PRPGs (STUMPS) configuration where the chip is configured into short scan chains. Each scan channel is fed by a pseudo-random pattern generator (PRPG) and the scan unload is collected in a multi-input signature register (MISR).

Once the device under test is initialized and configured, the LBIST engine loads the channels from the PRPG and executes a clock sequence. While the responses from the clock sequence are unloaded into the MISR, new values are loaded into the channels from the PRPG.

SUMMARY

According to an embodiment a method, system, and computer program product for implementing a clock path technique for using on-chip circuitry to generate a correct encode pattern to test the on-chip circuitry for encoding and correction of a chip are provided. A computer-implemented method may include initializing a scan of the chip including data and a set of check bits protecting the data; applying a global control bit to a latch on the chip; and applying an additional clock to the latch so the check bits are updated using the on-chip circuitry.

Additional features and advantages are realized through the techniques of the invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages thereof, are apparent from the following detailed description taken in conjunction with the accompanying drawings in which:

DETAILED DESCRIPTION

Various implementations are described below by referring to several embodiments of built-in self-test (BIST) encoded logic for an integrated circuit (also referred to herein as a "chip"). In embodiments, a special scan path is set up such that the correct error checking and correcting (ECC) check bits are made part of the scan initialization. The pre-existing ECC generation logic on the chip is used to generate the correct ECC parity. This not only tests the ECC parity logic but also tests the downstream logic in a system like manner. The remaining logic is tested with the random patterns from the logic built-in self-test sequence as usual. In an additional embodiment, logic may be added to randomly flip one of the ECC check bits to test the situation where there is a single bit error. In another embodiment, this testing concept can be applied to any encoded logic on the chip. Using similar methods, during the scan initialization, the correct parity can be loaded into parity latches.

Generally, a special path is set up such that on-chip ECC generation logic creates an initialization value for the ECC check bits as opposed to being randomized from the pseudo random pattern generator (PRGP). In other words, the on-chip ECC logic is used to generate a set of correct ECC check bits so that the logic is tested with correct bits instead of incorrect ECC check bits. This enables better coverage of the logic downstream. The present disclosure describes two approaches to initialize latches (i.e., check bit latches) with the correct ECC check bit from ECC generation logic. One approach updates the clocking while the other approach updates the scan path.

In some implementations, better (e.g., more thorough, faster, more efficient, etc.) testing of error detection and correction logic is provided. In other aspects, better (e.g., more thorough, faster, more efficient, etc.) at-speed testing of the correction logic is provided. The present aspects may also be applied to parity and other logic on the chip as well. The present disclosure can also enable improved testability with LBIST as well as reduced automatic test pattern generation (ATPG) patterns. These and other advantages will be apparent from the description that follows.

Figure 1:
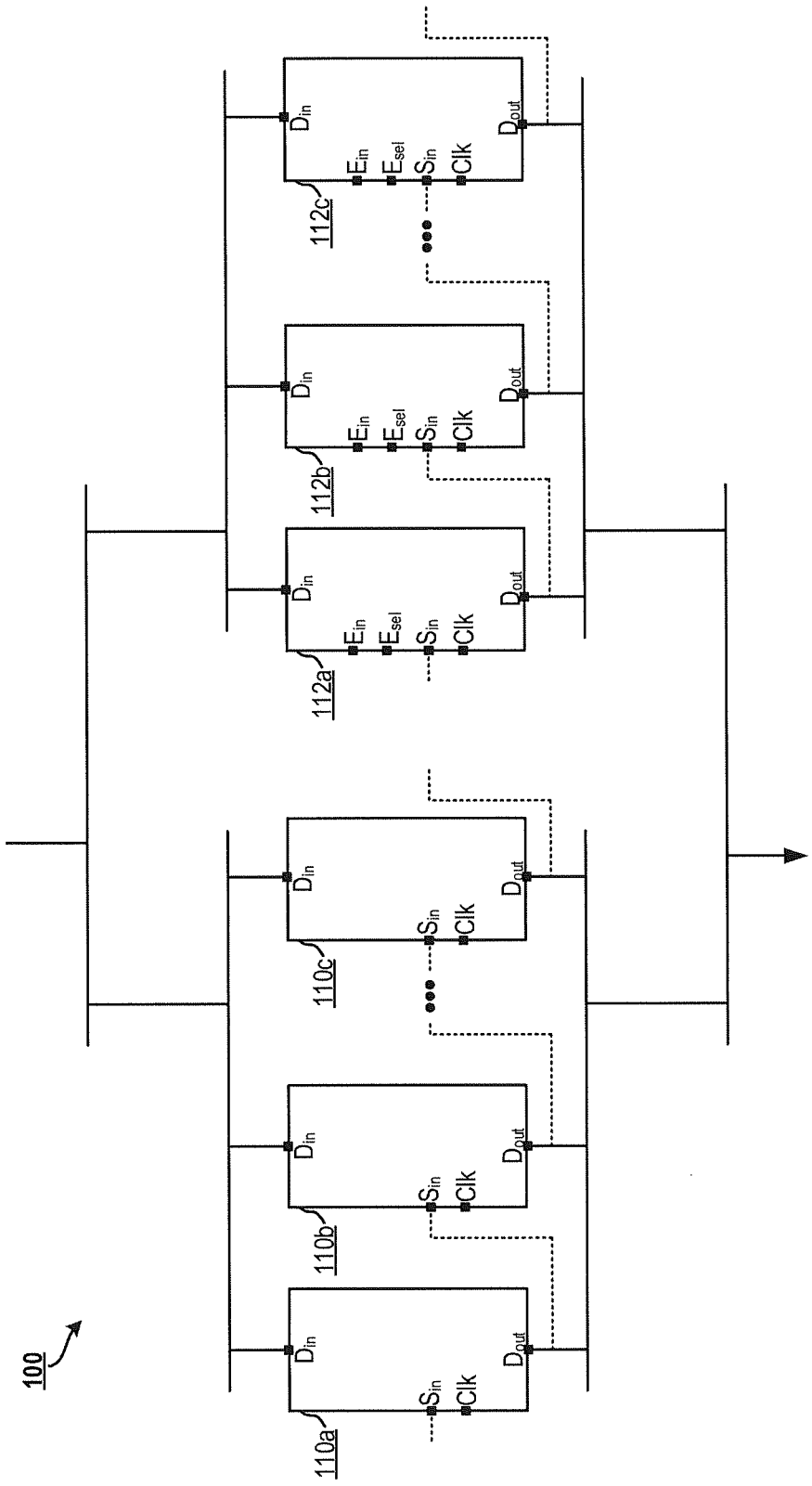
FIG. 1 illustrates a block diagram of a register with latches implemented with scan path functionality according to aspects of the present disclosure.

FIG. 1 illustrates a block diagram of a register 100 with latches implemented with scan path functionality according to aspects of the present disclosure. In particular, register 100 includes standard latches 110a, 110b, 110c and modified latches including scan path functionality (referred to as "scan path latches") 112a, 112b, 112c. It should be appreciated that standard latches and/or scan patch latches may added to and/or removed from register 100 in additional embodiments. In addition, it should be appreciated that, although FIG. 1 illustrates scan path latches 112a, 112b, 112c having a scan port, the scan path latches 112a, 112b, 112c may also contain an additional port for functional data.

According to aspects of the present disclosure, the scan path is modified to bypass scan path latches 112a, 112b, 112c. In some situations, during a scan, ECC check bit latches are initialized from the ECC generation logic of the chip. In an embodiment according to aspects of the present disclosure, these latches are selectively bypassed from the scan path such that they are essentially removed (i.e., bypassed) from the scan path. That is, ECC check bits are bypassed during the scan as opposed to traditional approaches which initialize the ECC check bits during a normal scan operation. After the scan, the check bits are initialized, such as from a syndrome generation logic.

In the embodiment illustrated in FIG. 1, standard latches 110a, 110b, 110c include a $D_{in}$ (data in) input and a $D_{out}$ (data out) output as well as an $S_{in}$ (scan in) input and a Clk (clock) input. Similarly, scan path latches 112a, 112b, 112c include a $D_{in}$ (data in) input and a $D_{out}$ (data out) output as well as an $S_{in}$ (scan in) input and a Clk (clock) input. In addition, scan path latches 112a, 112b, 112c also include $E_{in}$ (ECC in) and $E_{select}$ (ECC select) inputs.

During the scan, standard latches 110a, 110b, 110c are initialized. However, scan path latches 112a, 112b, 112c are bypassed according to embodiments of the present disclosure. In particular, $E_{select}$ (ECC select) input enables scan path latches 112a, 112b, 112c to be bypassed during a scan unlike standard latches 110a, 110b, 110c, which are not bypassed. In other words, register 100 splits out ECC check bits to be handled differently in scan path latches 112a, 112b, 112c using the $E_{in}$ and $E_{sel}$ inputs. $E_{sel}$ is a global control bit asserted during the scan sequence. When $E_{sel}$ goes high (i.e., has a binary value of 1), scan path latches 112a, 112b, 112c are forced out of the scan path (i.e., scan path latches 112a, 112b, 112c are bypassed). Scan path latches 112a, 112b, 112c instead receive an input at $E_{in}$, which represents the check bit from a syndrome generation logic during the scan.

Figure 2:
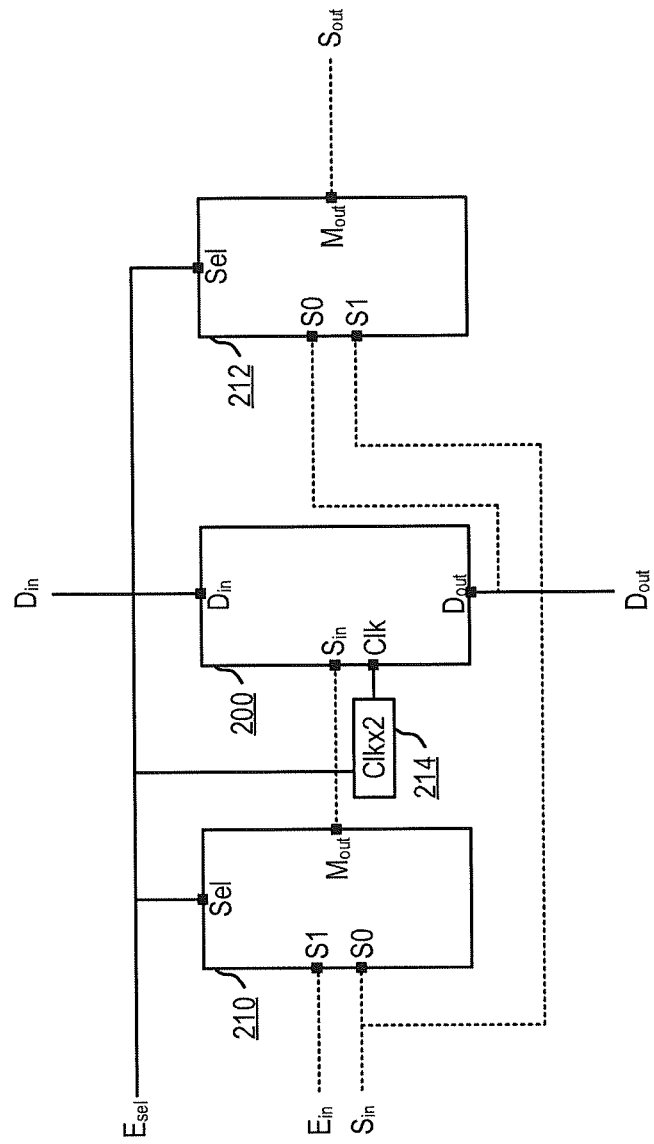
FIG. 2 illustrates a block diagram of a latch implemented with scan path functionality according to aspects of the present disclosure.

FIG. 2 illustrates a block diagram of a latch 200 implemented with scan path functionality according to aspects of the present disclosure. In particular, latch 210 is paired with a first multiplexer (MUX) 212 and a second MUX 214 to implement the scan path functionality described herein. In this way, latch 200 may be a standard latch (e.g., standard latches 110a, 110b, 110c of FIG. 1) whereas scan path latches 112a, 112b, 112c of FIG. 1 were modified to accommodate bypassing. The addition of MUX 212 and MUX 214 enable a standard latch to be used to accommodate bypassing.

In the present embodiment, $E_{sel}$ is a global control bit asserted during the scan sequence. When $E_{sel}$ goes high, latch 200 is forced out of the scan path (i.e., latch 200 is bypassed). Instead, latch 200 receives an input of $E_{in}$ at pin $S_{in}$ via MUX 212. Meanwhile, $S_{in}$ is passed around latch 200 and is output as $S_{out}$ via MUX 214. In particular, the input into MUX 212 is selected to be the value from the scan latch preceding latch 200 on the S1 path in MUX 212.

Although latch 200 is bypassed during the scan, latch 200 remains clocking. In particular, two clock pulses are needed. During the normal scan operation, latch 200 continues to clock. However, after the chip completes the normal scan operation, one additional clock cycle is needed to update latch 200 (the bypassed latch) with the data from $E_{in}$ (i.e., data from an ECC check bit generation logic). This enables the protected data and corresponding ECC check bits to launch together during the test cycle.

Once the scan is complete, latch 200 is initialized with $E_{in}$, a check bit from the check bit generation logic. $E_{sel}$ remains high to gate $E_{in}$ to the scan input of latch 200. When $E_{sel}$ is low, latch 200 is scanning as part of the normal scan operation. The $S_{in}$ data is selected at MUX 210 and the scan data out of latch 200 is selected for the scan path at MUX 212.

Figure 3:
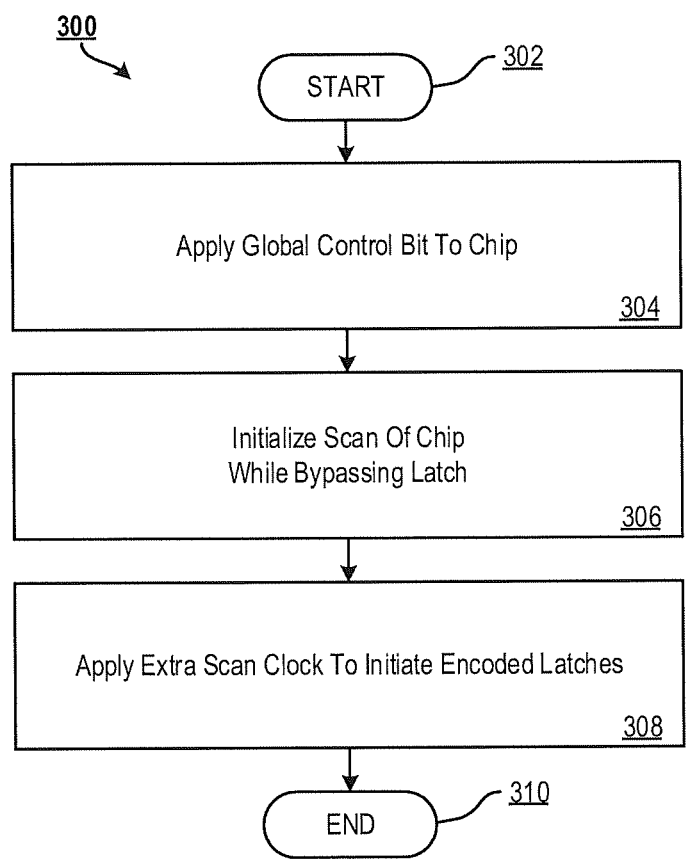
FIG. 3 illustrates a flow diagram of a method for initializing a latch with correct ECC check bits by modifying a scan path according to aspects of the present disclosure.

FIG. 3 illustrates a flow diagram of a method 300 for initializing a latch with correct ECC check bits by modifying a scan path according to aspects of the present disclosure. In other words, method 300 provides for bypassing a latch of a chip during a scan using on-chip circuitry to generate a correct encoded pattern to test the on-chip circuitry for defects.

Method 300 starts at block 302 and continues to block 304. At block 304, method 300 includes applying a global control bit to the chip. At block 306, method 300 includes initializing a scan of the chip while bypassing the latch. At block 308, method 300 includes applying an extra scan clock to initiate the latch. Method 300 continues to block 310 and ends.

Additional processes also may be included. For example, method 300 may include initializing the latch upon completion of the scan. The initializing may be performed using a check bit that is generated by a syndrome generation engine. The syndrome generation engine performs ECC check bit generation and provides logic feedback during the scan. In additional embodiments, bypassing the latch may further include applying the global control bit signal to a first multiplexer to apply a bypass signal to the latch and applying a select bit signal to a second multiplexer to pass the select bit signal as an output while bypassing the latch. In other embodiments, the latch remains clocking during the scan. During the clocking, a clock rate may double for the latch during the bypassing. Data being protected during the scan does not change during the scan. In additional examples, logic may be added to flip a latch (or multiple latches) of the data being protected to test the scenario when the result is off by one latch. Further, the check bits may be flipped by one bit to test the scenario when the result is off by one bit.

It should be understood that the processes depicted in FIG. 3 represent illustrations, and that other processes may be added or existing processes may be removed, modified, or rearranged without departing from the scope and spirit of the present disclosure.

Figure 4:
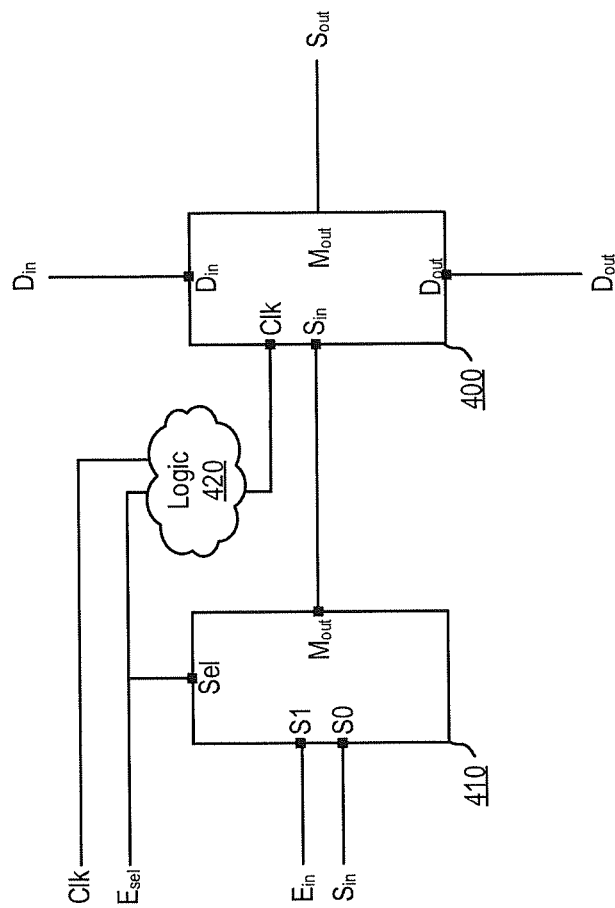
FIG. 4 illustrates a block diagram of a latch implemented with clock path functionality according to aspects of the present disclosure.

FIG. 4 illustrates a block diagram of a latch 400 implemented with clock path functionality according to aspects of the present disclosure. In some manufacturing patterns, after a scan is performed, a non-scan sequence is then performed. The non-scan sequence is needed and essential for initializing non-scan latches. Typically, only the non-scan latches are updated. The present embodiment provides for updating the scannable ECC check bits during the non-scan sequence. The ECC check bits are then updated based on the ECC check bit generation logic in the chip.

FIG. 4 illustrates a latch 400 where the scannable ECC check bit latches update during a non-scan fill sequence. A multiplexer (MUX) 410 is also provided, which selectively applies one of $E_{in}$ and $S_{in}$ based on $E_{sel}$. The output of MUX 410 is received at $S_{in}$ of latch 400, and $E_{sel}$, which is a gate to allow latch 400 to clock when it otherwise would not clock, is received at logic 420 of the $E_{sel}$ patch into the clock port of latch 400. Latch 400 outputs $S_{out}$. In some embodiments, $E_{sel}$ may be an internal set-up latch.

In the present embodiment, latches, such as latch 400, remain in the scan path and are scanned without being bypassed. As part of a normal scan sequence, a non-scan sequence (i.e., a special sequence during which latches are initialized) occurs after the scan sequence. During the non-scan sequence, $E_{sel}$ is activated and ECC check bits are initialized from the syndrome generation logic. MUX 410 is used to supply either $S_{in}$ or $E_{in}$ as an input to latch 400 dependent upon the $E_{sel}$ signal. The techniques described regarding FIG. 4 may also be applied to parity and other similarly encoded logic.

Figure 5:
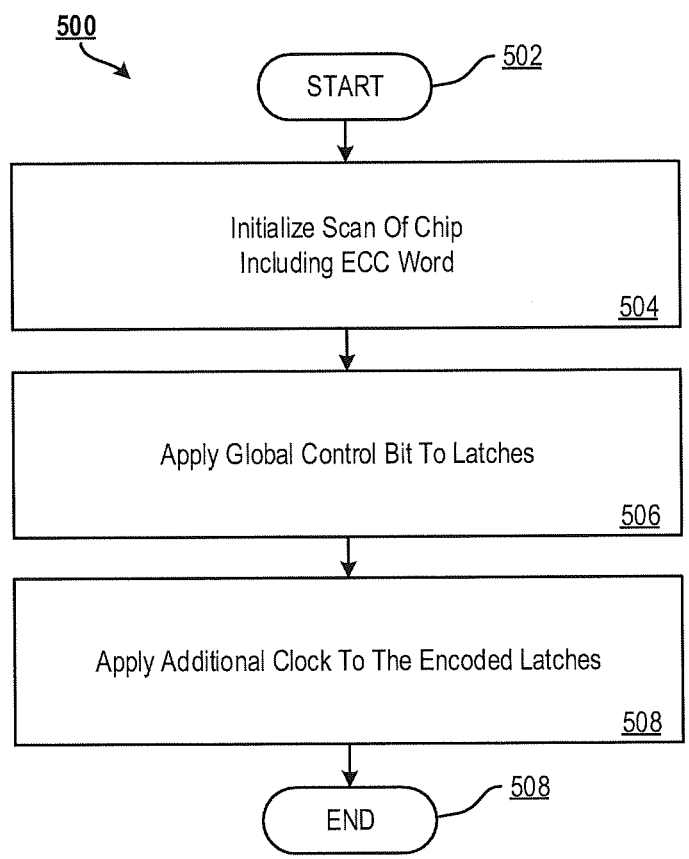
FIG. 5 illustrates a flow diagram of a method for implementing a clock path technique for testing a chip according to aspects of the present disclosure.

FIG. 5 illustrates a flow diagram of a method for implementing a clock path technique for testing a chip according to aspects of the present disclosure. Method 500 starts at block 502 and continues to block 504.

At block 504, method 500 includes initializing a scan of the chip including an ECC protected word. The ECC protected word represents the data protected by the ECC check bits, which are what the on-chip logic is generating and that are being applied to the latches with the extra clock. For any test pattern scanned into the ECC protected word, a good ECC check bit encoding occurs. At block 506, method 500 includes applying a global control bit to the latches.

At block 508, method 500 includes applying an additional clock to the latch. The additional clock does not change the ECC protected word latches but rather updates the check bits latches, replacing the scanned in value with the value from the check bit generation logic. The ECC protected word the check bits represent is not updated. In aspects of the present disclosure, the scan is completed before performing a non-scan sequence. In some embodiments, applying the clock cycle to update the ECC protected word includes applying the clock cycle to a latch that is not scannable or is not part of the latch being tested. Applying the clock cycle to update the ECC protected word may further include applying one of an ECC input signal and a scan input signal as determined by a multiplexer based on the global control bit signal. The non-scan sequence may initialize the latch being tested. In some embodiment, the ECC protected word is updated based on an ECC check bit generation logic in the chip. Method 500 continues to block 510 and ends.

In examples of the present disclosure, when the check bit latches are updated, the data that is being protected is not updated with the same clock. In additional examples, logic may be added to flip a latch (or multiple latches) of the data being protected to test the scenario when the result is off by one latch. Further, the check bits may be flipped by one bit to test the scenario when the result is off by one bit.

Additional processes may also be included. It should be understood that the processes depicted in FIG. 5 represent illustrations, and that other processes may be added or existing processes may be removed, modified, or rearranged without departing from the scope and spirit of the present disclosure.

Figure 6:
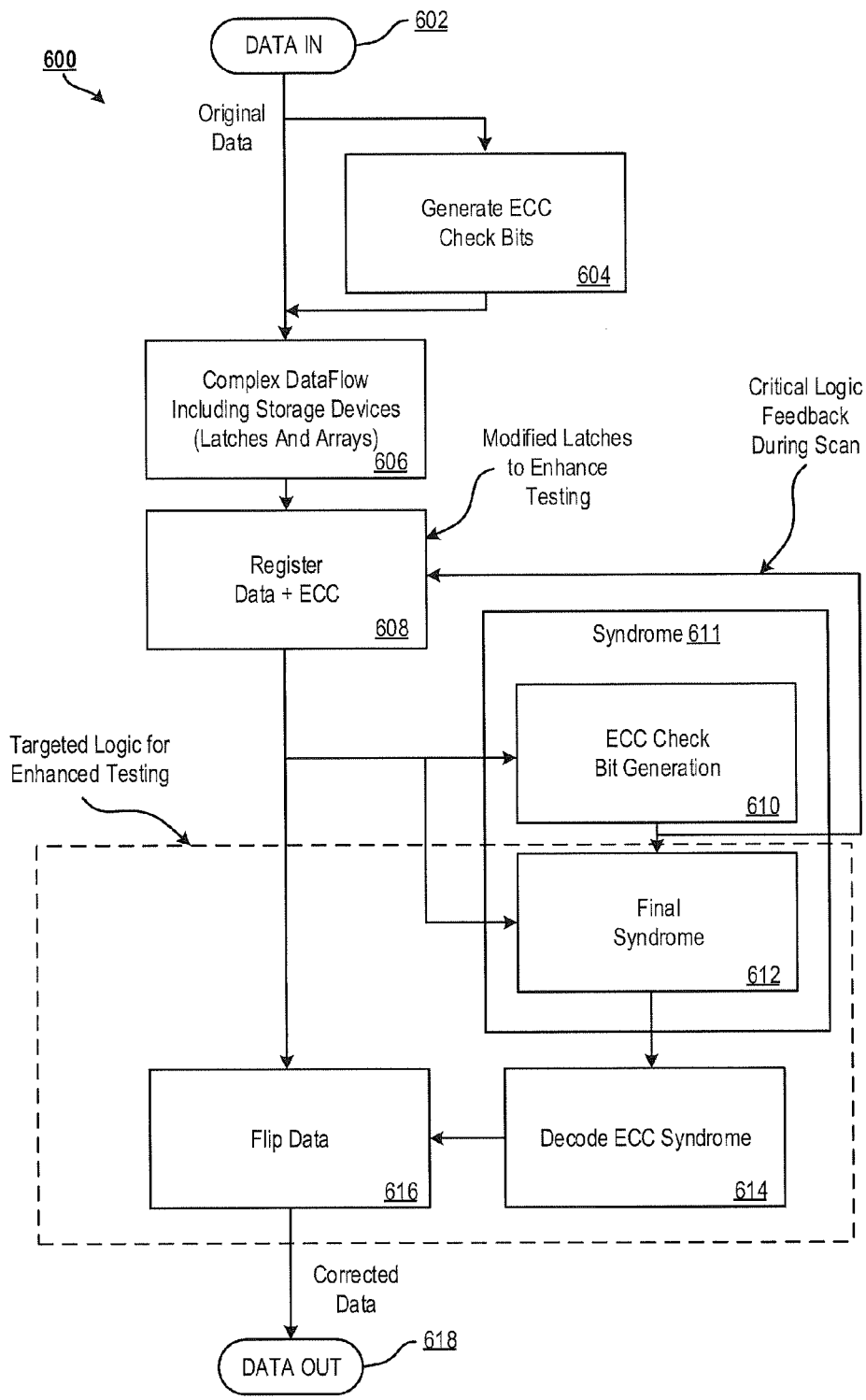
FIG. 6 illustrates a flow diagram of a data hardware flow 600 for an ECC protected word in a computer processing system to highlight components relevant to the invention according to aspects of the present disclosure.

FIG. 6 illustrates a flow diagram of a data hardware flow 600 for an ECC protected word in a processing according to aspects of the present disclosure.

Original data is received into the flow 600 at block 602. Block 604 generates ECC check bits to protect original data (ECC protected word) and these check bits are carried through the data's use in the system. In the present example, a complex data flow and/or storage represented by block 606 are provided. Once the data is retrieved from the data flow and/or storage, the data is checked by analyzing the data and check bit encodings passed out of block 606. The ECC protected word and check bits are analyzed by blocks 610, 612 and 614. If corrections to the ECC protected word and check bits are necessary, the data is manipulated by block 616.

Part of the analysis of the ECC protected word is the re-generation of the check bits by block 610. This output is then modified with the check bits carried along with the protected ECC protected word to form ECC syndrome bits in block 612. The ECC syndrome bits are an encoding that identifies the bit that needs to be corrected or if there are no errors. The decoding of the syndrome bits is done by block 614 with the correction of the data being performed by 616. Corrected data is then output at block 618.

In the present example, the check-bits are re-generated as part of the syndrome generation. The present techniques use the circuitry that performs this task to force correct encodings into the ECC check bits of block 608.

Additional blocks may also be included. It should be understood that the blocks depicted in FIG. 6 represent illustrations, and that other blocks may be added or existing blocks may be removed, modified, or rearranged without departing from the scope and spirit of the present disclosure.

Figure 7:
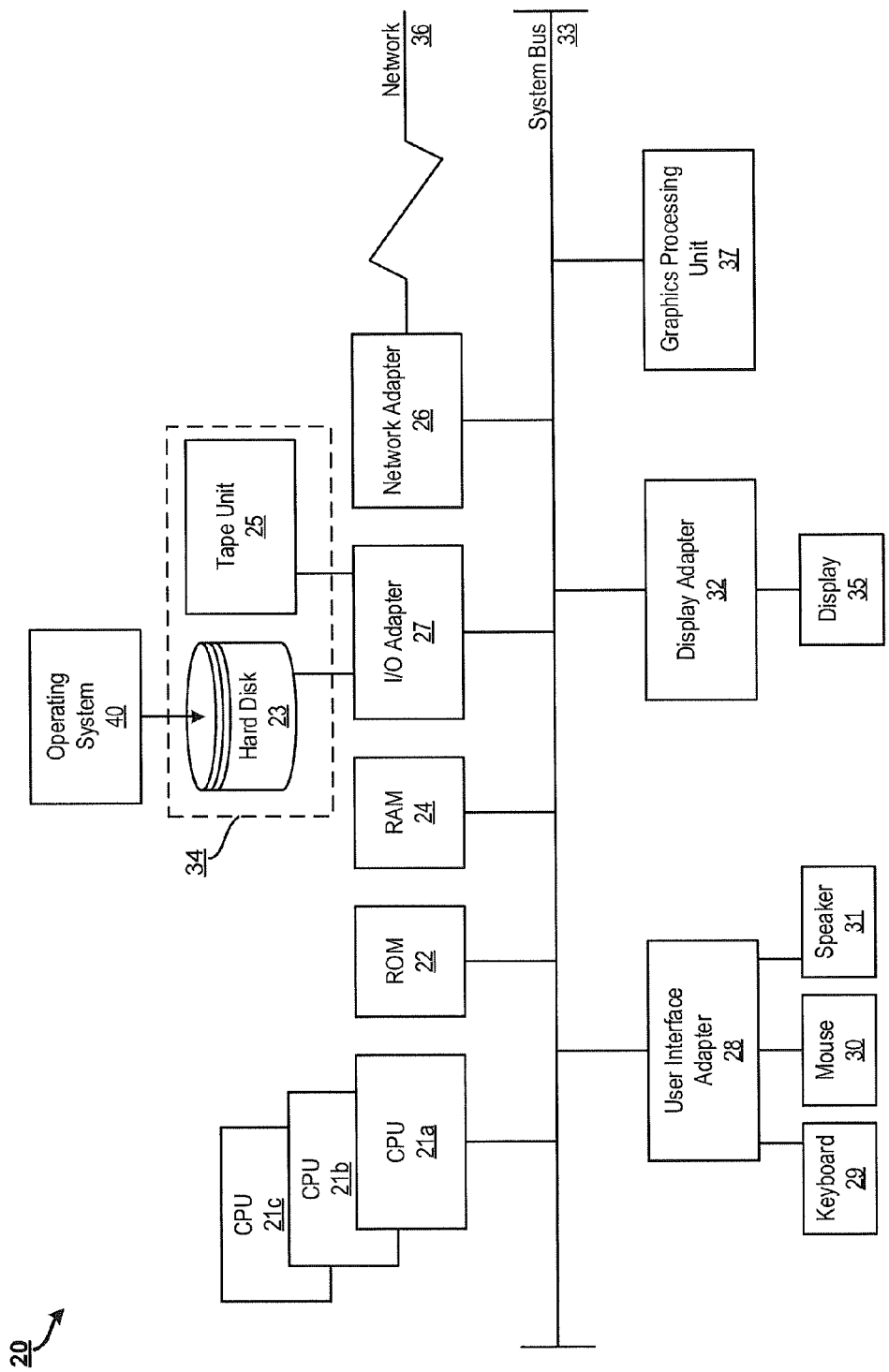
FIG. 7 illustrates a block diagram of a processing system for implementing the techniques described herein according to aspects of the present disclosure.

It is understood in advance that the present disclosure is capable of being implemented in conjunction with any other type of computing environment now known or later developed. For example, FIG. 7 illustrates a block diagram of a processing system 20 for implementing the techniques described herein. In embodiments, processing system 20 has one or more central processing units (processors) 21a, 21b, 21c, etc. (collectively or generically referred to as processor(s) 21). In aspects of the present disclosure, each processor 21 may include a reduced instruction set computer (RISC) microprocessor. Processors 21 are coupled to system memory (e.g., random access memory (RAM) 114) and various other components via a system bus 33. Read only memory (ROM) 22 is coupled to system bus 33 and may include a basic input/output system (BIOS), which controls certain basic functions of processing system 20.

Further illustrated are an input/output (I/O) adapter 27 and a communications adapter 26 coupled to system bus 33. I/O adapter 27 may be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 20 may be stored in mass storage 34. A network adapter 26 interconnects system bus 33 with an outside network 36 enabling processing system 20 to communicate with other such systems.

A display (e.g., a display monitor) 35 is connected to system bus 113 by display adaptor 32, which may include a graphics adapter to improve the performance of graphics intensive applications and a video controller. In one aspect of the present disclosure, adapters 26, 27, and/or 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 may be interconnected to system bus 33 via user interface adapter 28, which may include, for example, a Super I/O chip integrating multiple device adapters into a single integrated circuit.

In some aspects of the present disclosure, processing system 20 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing, and has a highly parallel structure that makes it more effective than general-purpose CPUs for algorithms where processing of large blocks of data is done in parallel.

Thus, as configured herein, processing system 20 includes processing capability in the form of processors 21, storage capability including system memory (e.g., RAM 24), and mass storage 34, input means such as keyboard 29 and mouse 30, and output capability including speaker 31 and display 35. In some aspects of the present disclosure, a portion of system memory (e.g., RAM 24) and mass storage 34 collectively store an operating system such as the AIX® operating system from IBM Corporation to coordinate the functions of the various components shown in processing system 20.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various aspects of the present disclosure have been presented for purposes of illustration, but are not intended to be exhaustive or limited to the embodiments disclosed. Many modifications and variations will be apparent to those of ordinary skill in the art without departing from the scope and spirit of the described techniques. The terminology used herein was chosen to best explain the principles of the present techniques, the practical application or technical improvement over technologies found in the marketplace, or to enable others of ordinary skill in the art to understand the techniques disclosed herein.

What is claimed is:

1. A computer-implemented method for implementing a clock path technique, the method comprising:
    initializing a scan of a chip including data and a set of check bits protecting the data;
    applying a global control bit to a latch on the chip during the scan; and
    applying an additional clock cycle to the latch so the check bits are updated using the on-chip circuitry based at least in part on the scan completing.

2. The computer-implemented method of claim 1, further comprising:
    flipping the set of check bits by one bit to test a scenario when a result of the scan indicates that one bit is incorrect.

3. The computer-implemented method of claim 1, further comprising:
    flipping a bit of the latch of the data being protected to test a scenario when a result of the scan indicates that one latch is incorrect.

4. The computer-implemented method of claim 1, wherein the scan is completed before applying the additional clock to the latch.

5. The computer-implemented method of claim 1, wherein applying the additional clock to update the set of check bits comprises applying the additional clock to a latch that is not scannable.

6. The computer-implemented method of claim 1, wherein applying the additional clock cycle further comprises applying one of an ECC input signal and a scan input signal as determined by a multiplexer based on the global control bit.

7. The computer-implemented method of claim 1, further comprising:
    initializing the latch after applying the additional clock to the latch.

* * * * *